US012777591B2

(12) United States Patent
Rotte

(10) Patent No.: US 12,777,591 B2
(45) Date of Patent: Oct. 27, 2026

(54) DEVICE FOR PRODUCING MULTI-LAYER CIRCUIT BOARDS AND USE THEREOF IN A MULTI-LEVEL HEAT PRESS

(71) Applicant: Ulrich Rotte Anlagenbau und Foerdertechnik GmbH, Salzkotten (DE)

(72) Inventor: Ulrich Rotte, Salzkotten (DE)

(73) Assignee: Ulrich Rotte Anlagenbau und Foerdertechnik GmbH, Salzkotten (DE)

( * ) Notice: Subject to any disclaimer, the term of this patent is extended or adjusted under 35 U.S.C. 154(b) by 71 days.

(21) Appl. No.: 18/604,459

(22) Filed: Mar. 13, 2024

(65) Prior Publication Data

US 2024/0224433 A1 Jul. 4, 2024

Related U.S. Application Data

(63) Continuation of application No. PCT/DE2022/100669, filed on Sep. 12, 2022.

(30) Foreign Application Priority Data

Sep. 14, 2021 (DE) ..................... 10 2021 123 684.3

(51) Int. Cl.
*B32B 41/00* (2006.01)
*H05K 3/46* (2006.01)

(52) U.S. Cl.
CPC ......... *H05K 3/46* (2013.01); *H05K 2203/068* (2013.01); *H05K 2203/163* (2013.01)

(58) Field of Classification Search
CPC ............... H05K 3/46; H05K 2203/068; H05K 2203/163; H05K 3/4611; B32B 37/0046;
(Continued)

(56) References Cited

U.S. PATENT DOCUMENTS

| | | | |
|---|---|---|---|
| 8,699,660 | B2 | 4/2014 | Joshi et al. |
| 2011/0207392 | A1 | 8/2011 | Ebermann et al. |
| 2014/0020245 | A1 | 1/2014 | Ceraso |

FOREIGN PATENT DOCUMENTS

| | | | |
|---|---|---|---|
| CN | 102217432 | A | 10/2011 |
| CN | 103376809 | A | 10/2013 |

(Continued)

OTHER PUBLICATIONS

International Search Report dated Jan. 17, 2023 in corresponding application PCT/DE2022/100669.

(Continued)

*Primary Examiner* — Michael N Orlando
*Assistant Examiner* — Joshel Rivera
(74) *Attorney, Agent, or Firm* — Muncy, Geissler, Olds & Lowe, P.C.

(57) ABSTRACT

A device for producing multi-layer circuit boards, comprising a multi-part tool having a tool lower part and a tool upper part. In the intended use of the tool, multiple functional layers and at least one insulating layer of a multi-layer circuit board to be produced are arranged between the tool lower part and the tool upper part. At least one measuring transducer, is provided between the tool upper part and the tool lower part and is in contact with at least one functional layer and/or an insulating layer of the multi-layer circuit board to be produced. A tool logic module and a measurement value transmission module with a receiving unit and with a transmission unit are provided. The tool logic module is retained on the tool and designed for receiving measurement values of the measuring transducer and wherein the tool logic module has a transmitter.

21 Claims, 5 Drawing Sheets

(58) Field of Classification Search
CPC ....... B32B 37/06; B32B 37/18; B32B 37/182; B32B 38/004; B32B 39/00; B32B 41/00; B32B 2307/202; B32B 2457/08
USPC .................... 156/60, 64, 350, 351, 378, 379
See application file for complete search history.

(56) References Cited

FOREIGN PATENT DOCUMENTS

| | | | |
|---|---|---|---|
| DE | 102016113985 | A1 | 2/2018 |
| IT | 201900001739 | A1 | 8/2020 |
| KR | 102041831 | B1 | 11/2019 |

OTHER PUBLICATIONS

Chinese Office Action dated Nov. 15, 2025 in corresponding application CN 202280060518.7.

DEVICE FOR PRODUCING MULTI-LAYER CIRCUIT BOARDS AND USE THEREOF IN A MULTI-LEVEL HEAT PRESS

This nonprovisional application is a continuation of International Application No. PCT/DE2022/100669, which was filed on Sep. 12, 2022, and which claims priority to German Patent Application No. 10 2021 123 684.3, which was filed in Germany on Sep. 14, 2021, and which are both herein incorporated by reference.

BACKGROUND OF THE INVENTION

Field of the Invention

The invention relates to a device for the production of multi-layer circuit boards comprising a multi-part tool with a tool lower part and a tool upper part, wherein, during normal use of the tool, a plurality of functional layers and at least one insulation layer of a multi-layer circuit board to be produced are disposed between the tool lower part and the tool upper part, and comprising at least one measurement value sensor, wherein the measurement value sensor is provided between the tool upper part and the tool lower part and is placed against at least one functional layer and/or insulation layer of the multi-layer circuit board to be produced.

Description of the Background Art

Multi-layer circuit boards are currently usually produced in a multi-platen heat press, wherein suitable process parameters for the operation of the multi-platen press heater are determined within experimental testing of the production process, and the subsequent mass production is carried out using the process parameters experimentally determined in this way. In order to ascertain the necessary parameters during the experimental testing, in particular copper-based functional layers and insulation layers are laid one on top of the other in an alternating manner in the tool as a preparatory step. A temperature sensor as the measurement value sensor is positioned between two of these layers and a signal line is fed out of the tool. The temperature sensor thus forms a lost sensor which cannot be reused.

A free end of the signal line is typically temporarily fixed to an outer side of the tool, for example by means of an adhesive strip. The tool thus equipped is then inserted with a large number of further tools into a multi-platen heat press. The tool lower part thus lies on a heating plate of the multi-platen heat press and is aligned and/or positioned relative to same. The heating plate serves as the support for the tool. The tool upper part is spaced apart from a further heating plate disposed above same, which—with the exception of the uppermost heating plate—supports a further equipped tool.

Now, in order to be able to ascertain measurement values and to determine process parameters in the experimental testing, the free ends of the signal line are released from the respective tool and connected to a data storage box which is disposed with the heating plates and the tools in a thermo-compression chamber of the multi-platen heat press. The thermo-compression chamber is then closed and the heating plates are moved towards each other in such a way that the tools are located sandwiched between two heating plates and heat the equipped tools, wherein the functional and insulation layers in the tool are connected under pressure. During this process, in particular the temperature inside the tool is measured by means of the temperature sensor.

The determination of the process parameters is effected off-line within the experimental testing. During the experimental testing, the data are merely captured and collected in the data storage box. The processing and evaluation of the data are effected downstream. The measurement values ascertained during the experimental testing specifically do not serve for intervention in the on-going production process in a controlling or regulating manner. Furthermore, by reason of the restricted space available and the temperatures of typically 100° C. or more prevailing there, the work involved in manually cabling the individual temperature sensors in the hot multi-platen heat press is laborious, time-consuming and involves a burns risk for the machine operator.

In exceptional cases, the procedure described above for the case of experimental testing is also applied within the mass production of circuit boards. However, by reason of the large amount of time involved and the high costs associated therewith, this work is only carried out in exceptional cases, for example when the circuit boards to be produced are used in safety-critical applications and the user thus places particular demands on production monitoring and documentation. However, use of the measurement values for on-line intervention in the on-going production process is also not effected in this case

SUMMARY OF THE INVENTION

It is therefore an object of the present invention to provide an improved device for the production of multi-layer circuit boards.

In order to achieve this object the invention is characterized in an example in that a tool logic module and a measurement value transmission module with a receiving unit and with a transmitting unit cooperating with the receiving unit are provided, wherein the tool logic module is held on the tool and is arranged for reception of measurement values from the measurement value sensor and wherein the tool logic module comprises a transmitter which is arranged for wireless forwarding of the measurement values and/or data obtained therefrom to the receiving unit of the measurement value transmission module, that a data line running from the transmitting unit of the measurement value transmission module to a superordinate production control device is provided and that the transmitting unit is arranged for onward transmission of the measurement values received by the receiving unit and/or of the data obtained therefrom to the superordinate production control device via the data line.

A particular advantage of the invention is that the measurement values obtained during the process and/or the data obtained therefrom are transmitted in a hybrid manner, i.e. partially wirelessly and partially in a cable-bound or wire-bound manner. In this respect, the complete signal chain from the measurement value sensor to the transmitter of the tool logic module can be produced in a preparatory manner as part of the equipping of the tool. This takes place outside the thermo-compression chamber of the multi-platen heat press. The tool thus prepared can then be inserted into the multi-platen heat press. The transmitter of the tool logic module is disposed adjacent to the receiving unit of the measurement value transmission module, which unit is permanently provided in the thermo-compression chamber. As a result, there is absolutely no need for manual cabling of the measurement value sensor in the thermo-compression chamber. In this respect, the equipping of the multi-platen heat press is significantly simplified and there is no longer any risk that the machine operator will be burned during cabling of the measurement value sensor.

In addition, the measurement values which the measurement value sensor obtains during the on-going process, and/or the data obtained therefrom pass via the tool logic module to the measurement value transmission module and from that location are forwarded via the data line to the production control device of the multi-platen heat press. Consequently, the measurement values are thus made available to the production control device on-line during the on-going production cycle and with the aid of the measurement values the production control device can monitor the progress of production and/or intervene in the on-going process. In this way, the quality of production is thereby successfully increased and waste is successfully reduced to a considerable extent. In addition, should any correctable errors still arise during production, this is immediately detected and it is possible to avoid faulty products passing into circulation and being put into use.

The measurement values themselves, which are obtained with the aid of the measurement value sensor, or the data obtained therefrom, can be transmitted wirelessly or in a cable-bound or wire-bound manner. The term "data obtained therefrom" can include in particular, but not exclusively, data which are obtained by smoothing, compression, aggregation and/or mathematical processing of the measurement values of the measurement value sensor.

A pressure sensor, a temperature sensor and/or a moisture sensor can be provided as the measurement value sensor. These measurement value sensors advantageously provide measurement values which can provide information about the quality and/or functional capability of the circuit board and/or be used to control the on-going production process. In particular, through the possibility of the on-line influence on the on-going production process, processing times can be successfully reduced to a minimum without disadvantageously influencing the quality and functional capability of the circuit boards. Pressure and/or temperature in the multi-platen heat press are maintained so long and adjusted in such a manner that the functional and insulation layers are reliably connected to each other in the desired manner.

The signal line can serve to transmit the measurement values of the measurement value sensor to the tool logic module. In particular, a thermo-wire can be used for this purpose, which at the same time forms the temperature sensor and the signal line. Advantageously, the use of the thermo-wire means that the device is very cost-effective to produce.

The receiving unit of the measurement value transmission module can be fixedly allocated to the heating plate and/or is mounted thereon. In this way, when inserting the tool into the multi-platen heat press and during alignment thereof with respect to the heating plate, the tool logic module mounted on the tool can advantageously be positioned relative to the receiving unit at the same time. There is no separate alignment of the tool or of the transmitter with respect to the receiving unit, with the result that the equipping of the multi-platen heat press is further simplified and the burden on the machine operator is significantly reduced.

The tool logic module or parts thereof can be cooled fluidically. For this purpose, the tool logic module provided in the thermo-compression chamber of the multi-platen heat press during production provides a housing in which a receiver for reception of the measurement values, a processor for aggregating and/or post-processing of the measurement values and/or the transmitter are disposed. Furthermore, an inlet opening and an outlet opening for a cooling fluid are formed on the housing and the housing itself forms a fluid duct for the cooling fluid or surrounds such a duct. Ambient air, for example, can be used as the cooling fluid, this air being supplied from outside the thermo-compression chamber. Temperature-sensitive functional components of the tool logic module, for example the receiver for reception of the measurement values, the processor for aggregating and/or post-processing of the measurement values and/or the transmitter can advantageously be actively cooled during production of the circuit board. In this way, the temperature of said functional components is successfully limited to 120° C. or lower and, as a result, faults in the functional components of the tool logic module are successfully avoided although the temperature for connecting the functional and insulation layers is about 180° C.

Fluid lines for the cooling fluid can be run to a support body—allocated to the heating plate—of the measurement value transmission module. Elastically deformable connection sleeves can be provided between the support body of the measurement value transmission module and the housing of the tool logic module, which sleeves, during insertion of the tool into the multi-platen heat press, connect the fluid lines to the inlet and outlet opening formed on the housing. In this respect, the cooling circuit is formed in closed manner directly upon insertion of the tool into the multi-platen heat press. There is no manual connection of the fluid lines to the cooling duct of the tool logic module. In this way, the burden on the machine operator is again reduced.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
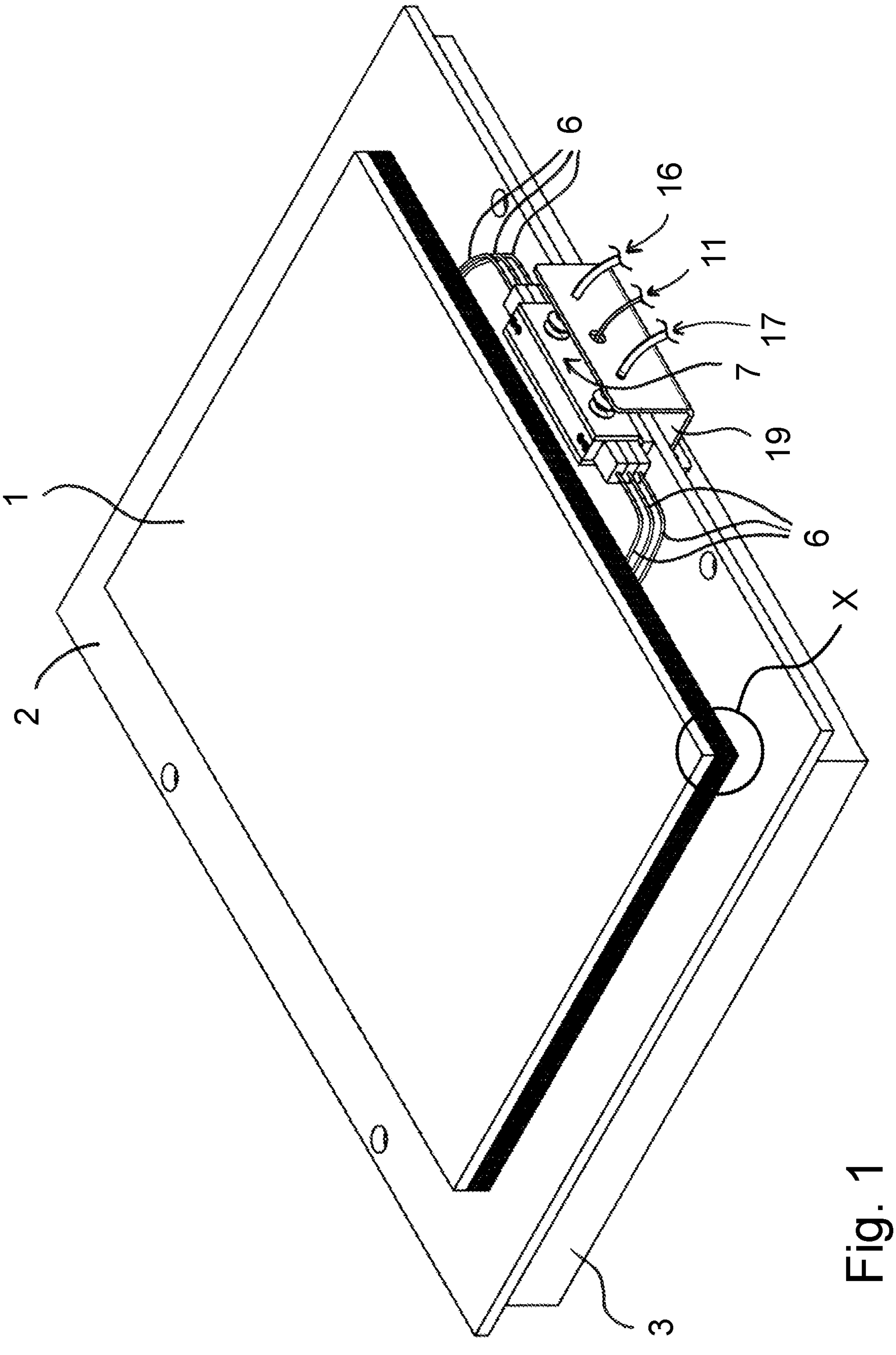
FIG. 1 is a perspective partial view of a device in accordance with the invention for the production of multi-layer circuit boards with an equipped multi-part tool, a tool logic module and a measurement value transmission module, wherein a tool lower part of the tool is placed onto a heating plate and a receiving unit of the measurement value transmission module is held on the heating plate.
Figure 3:
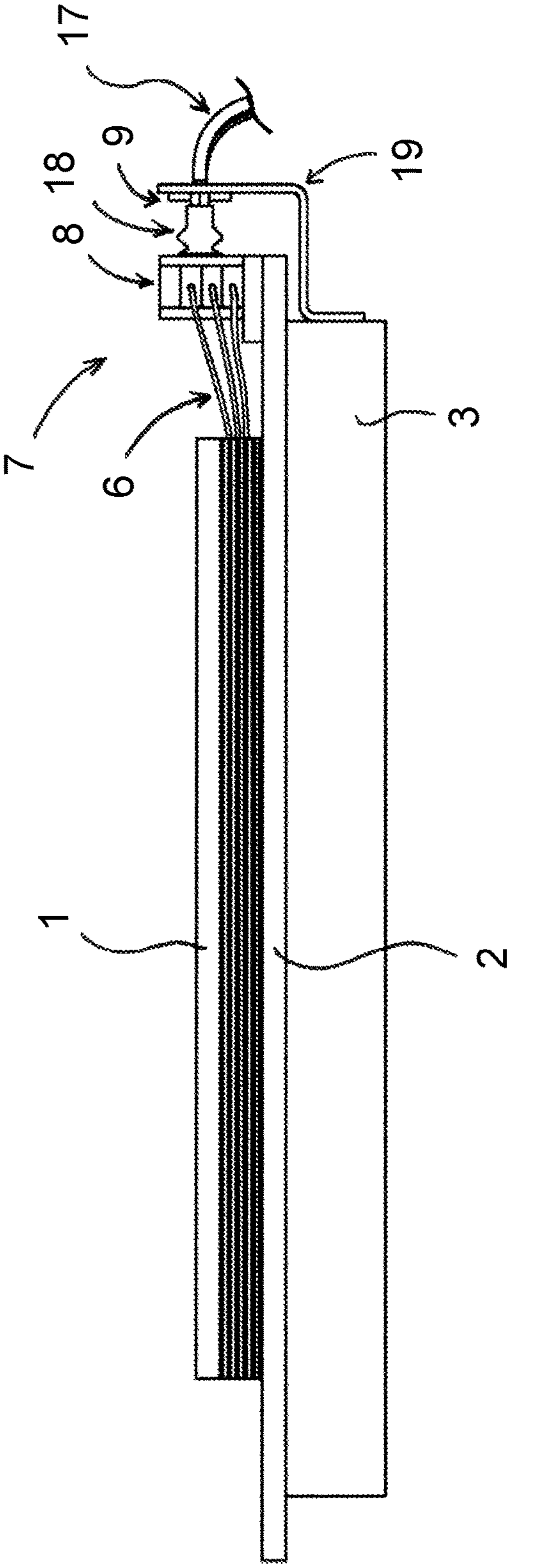
FIG. 3 is a side view of the arrangement according to FIG. 1.
Figure 2:
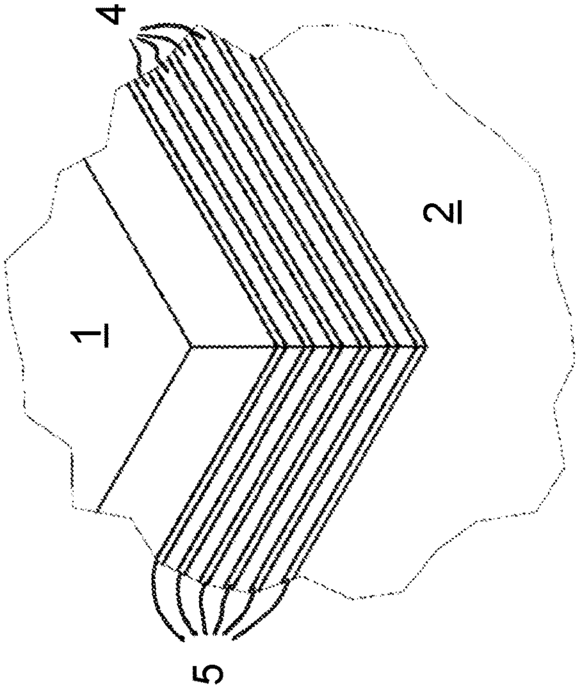
FIG. 2 is an enlarged illustration of a detail X of the arrangement according to FIG. 1.
Figure 4:
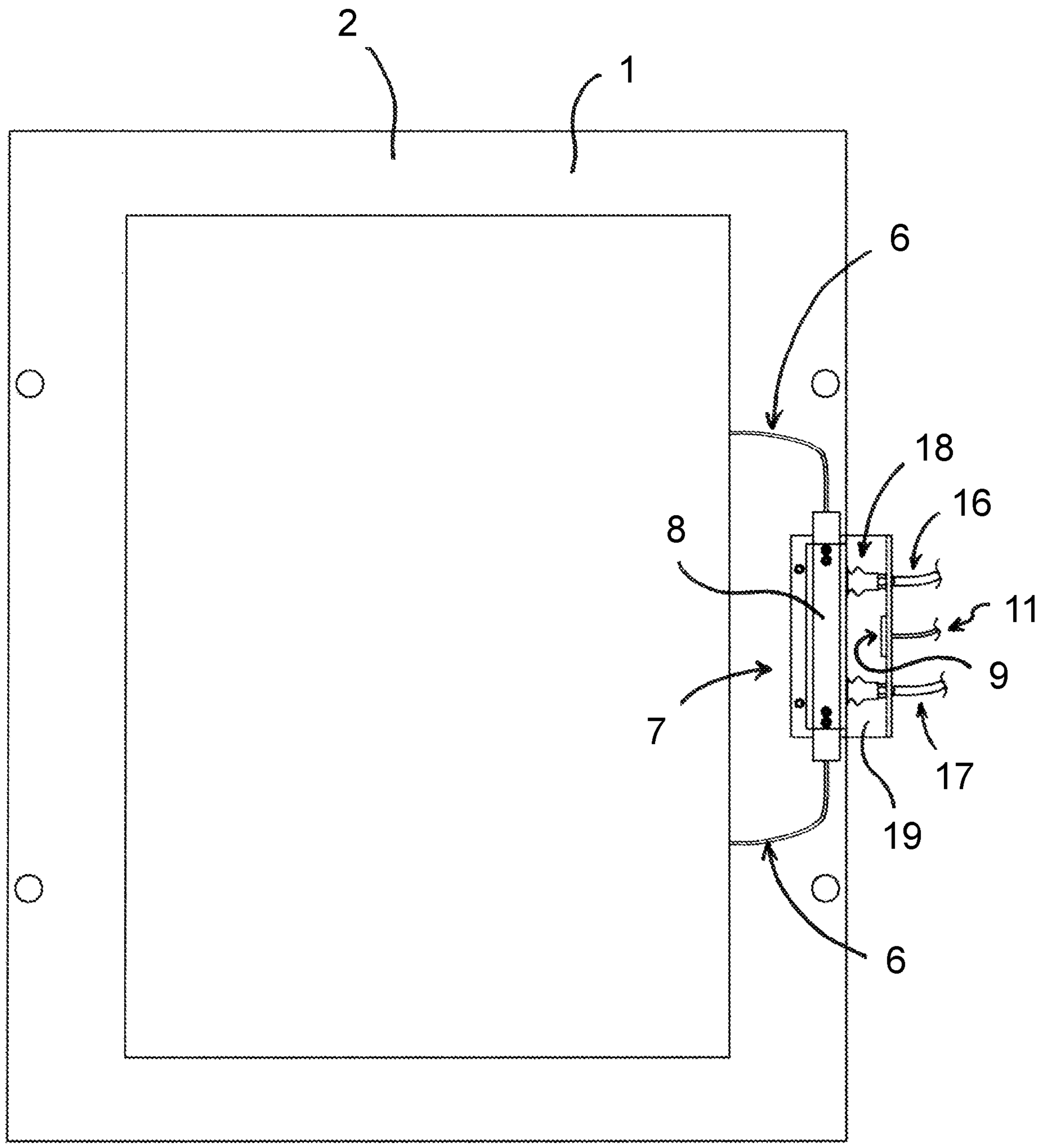
FIG. 4 is a top view of the arrangement of FIG. 1.
Figure 5:
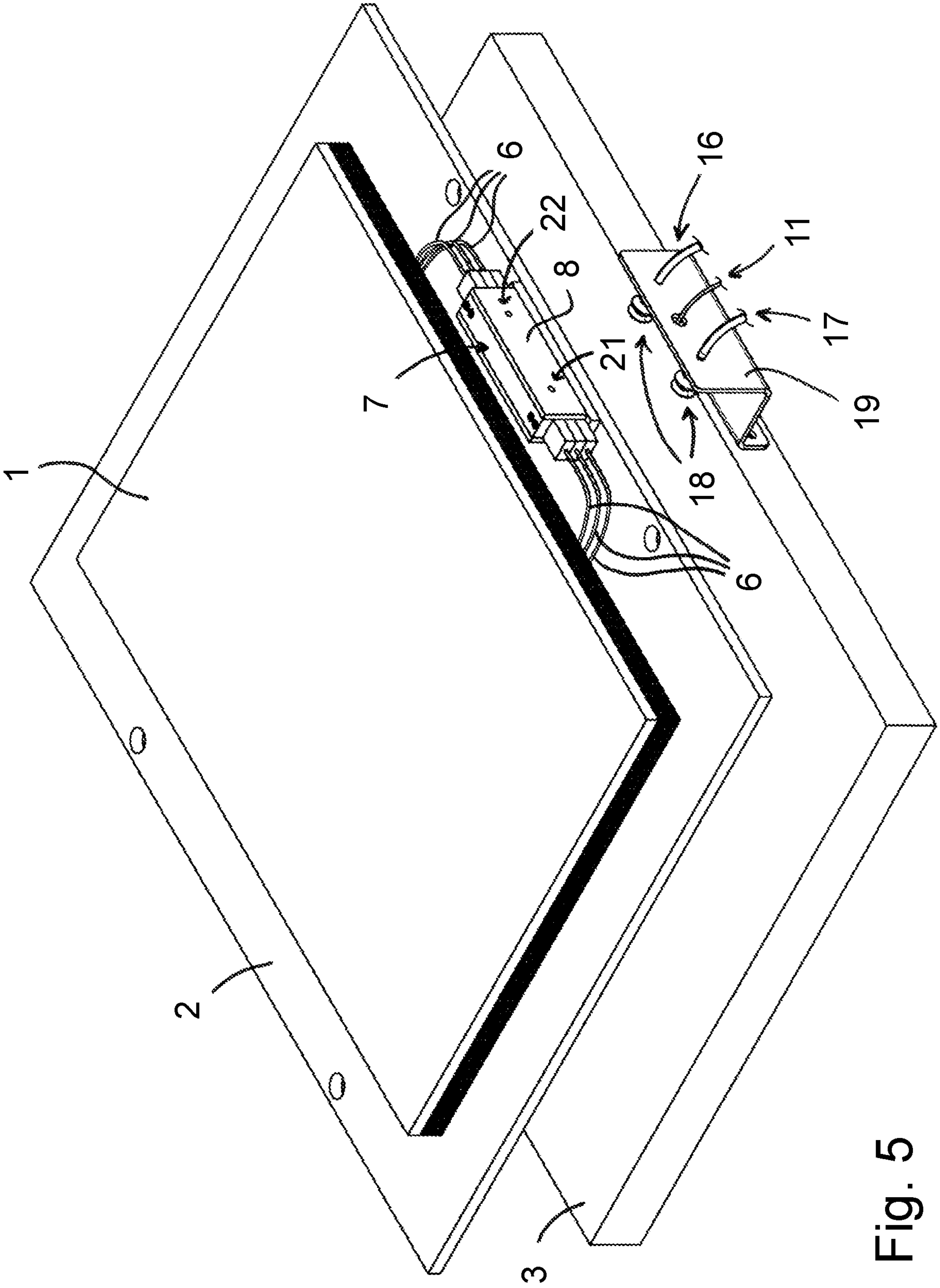
FIG. 5 is an exploded view of the arrangement according to FIG. 1, wherein the equipped, multi-part tool with the tool logic module mounted thereon is disposed spaced apart from the heating plate.
Figure 6:
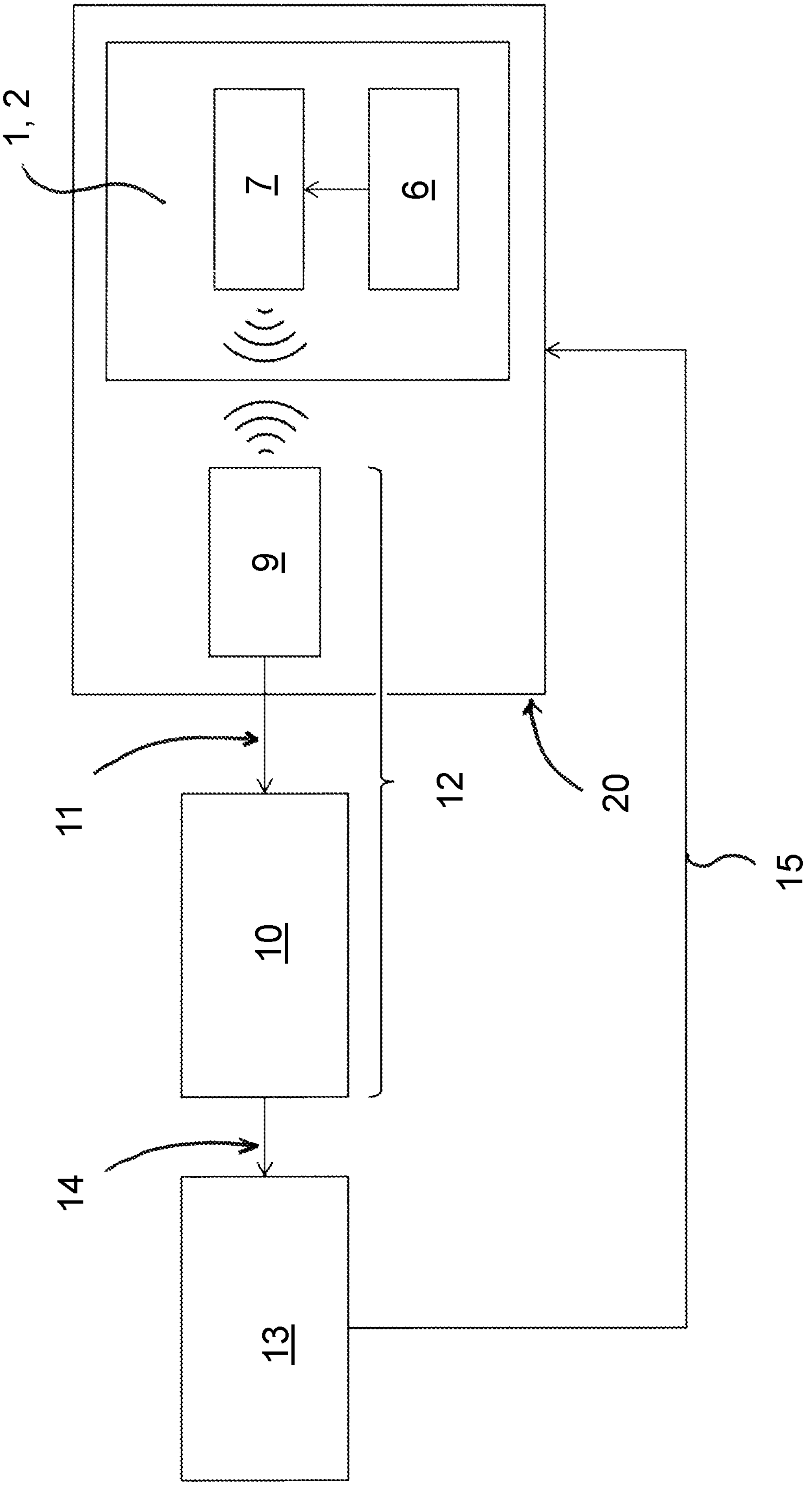
FIG. 6 is a schematic diagram of the device in accordance with the invention as part of a multi-platen heat press with a production control device.

A device in accordance with the invention for the production of multi-layer circuit boards comprises a multi-part tool with a tool lower part 2 and a tool upper part 1, a measurement value sensor and a tool logic module 7, to which measurement values detected by the measurement value sensor are supplied via a signal line. Furthermore, the device comprises a measurement value transmission module 12 with a receiving unit 9 and a transmitting unit 10 as well as a data line 14 serving for onward transmission of the measurement values or of data obtained therefrom. The receiving unit 9 and the transmitting unit 10 of the measurement value transmission module 12 are disposed physically separate from each other and, in the present case, are connected to each other in terms of data technology via a line 11.

During normal use of the device in accordance with the invention, the tool with the tool upper part 1 and the tool lower part 2, the tool logic module 7, the measurement value sensor and the receiving unit 9 of the measurement value transmission module 12 are disposed together with a plurality of heating plates 3 in a thermo-compression chamber 20 of a multi-platen heat press. The transmitting unit 10 of the measurement value transmission module 12 and a production control device 13—connected via the data line 14 to the transmitting unit 10—of the multi-platen heat press are provided outside the thermo-compression chamber 20. The production control device 13, the thermo-compression chamber 20 and the heating plates 3 are not part of the device in accordance with the invention. However, together with the device in accordance with the invention, they belong to the multi-platen heat press.

During the production of multi-layer circuit boards, initially in a preparatory step outside the thermo-compression chamber 20 of the multi-platen heat press, functional layers 5 and insulation layers 4 of the circuit board to be produced are disposed in the tool in an alternating manner and are layered between the tool upper part 1 and the tool lower part 2. During the layering, in the present example of the invention, a total of six thermo-wires 6, which at the same time form the measurement value sensor and the signal line of the device in accordance with the invention, are disposed between the layers 4, 5. The thermo-wires 6 are preferably arranged between different layers 4, 5 so that the thermo-wires 6 lie outside the circuit board of the layer construction, which is subsequently to be produced by cutting.

The thermo-wires 6 are passed out of the layer construction to the tool logic module 7 and contacted at that location. The tool logic module 7, which provides a housing 8, a transmitter and further functional components for the reception and/or storage and/or post-processing of the measurement values, is fixed to the tool lower part 2 of the tool. The internal structure of the tool logic module 7 is produced in such a way that the measurement values supplied via the signal line reach the transmitter.

In the manner described above, during preparation for the production of the multi-layer circuit boards, a plurality of tools are pre-configured and transported to the multi-platen heat press via a suitable handler, preferably in an automated manner. The plurality of tools are then inserted into the thermo-compression chamber 20 of the multi-platen heat press in such a way that each tool is laid from above with an underside of its tool lower part 2 onto a heating plate 3 and is positioned relative thereto. In so doing, the number of the heating plates 3 in the thermo-compression chamber 20 is preferably selected in such a way that one heating plate 3 is provided under each tool lower part 2 and that, in addition, a further heating plate 3 is provided above the tool upper part 1 of an uppermost tool in the thermo-compression chamber 20.

During insertion of the tools into the thermo-compression chamber 20 of the multi-platen heat press, the tool logic module 7 is positioned with the transmitter adjacent to the receiving unit 9—likewise installed in the thermo-compression chamber 20—of the measurement value transmission module 12. Between the transmitter of the tool logic module 7 and the receiving unit 9 of the measurement value transmission module 12, a distance is selected in such a way that a wireless transmission of the measurement values or of the data obtained therefrom from the transmitter of the tool logic module 7 to the receiving unit 9 is possible.

In the present case, the wireless transmission is effected by way of example using a near field communication routine. The transmitter of the tool logic module 7 then comprises, for example, an NFC coil (NFC: Near Field Communication) and the receiving unit 9 of the measurement value transmission module 12 is designed as an NFC reader or provides such an NFC reader. The NFC coil and the NFC reader cooperate in such a way that the measurement values or the data obtained therefrom are transmitted or forwarded wirelessly. For example, a power supply for the tool logic module (7) is produced within the NFC communication via the measurement value transmission module (12).

In order to safeguard the transmitter of each tool relative to the receiving unit 9 of the measurement value transmission module 12 allocated to the respective tool at the same time as the tools are being positioned on the heating plates 3, a support body 19 is provided on each heating plate 3, to which support body the receiving unit 9 is fastened. In the present example of the invention, the support body 19 is formed, by way of example, by a double L-shaped or Z-shaped profiled body.

Now, in order to connect the functional layers and insulation layers 4, 5 arranged in the tool to each other, the thermo-compression chamber 20 is heated to about 180° C. At the same time, the heating plates 3 are moved towards each other and in this way the layers 4, 5 are pressed against each other in the tools. After a certain holding time, which varies in particular depending on the temperature, the pressure and the material of the functional and insulation layers 4, 5 used, the layers 4, 5 are then connected to each other in an integrally bonded manner, wherein adjacent functional layers 5 are each separated from each other and insulated with respect to each other by an insulation layer 4. The thermo-wires 6 are fixedly connected to the layer construction. As lost sensors they cannot be reused.

In order to protect the functional components of the tool logic module 7 and in particular the transmitter against an excessively high temperature, in the present example of the invention, fluidic cooling is effected for the tool logic module 7. The fluidic cooling provides two fluid lines 16, 17, via which a cooling fluid is supplied and discharged. Furthermore, an inlet opening 21 and an outlet opening 22 for the cooling fluid are provided on the housing 8 of the tool logic module 7.

Elastic connection sleeves 18, which are fixed to the support body 19 on a side facing the tool logic module, are used to connect the inlet opening and outlet opening 21, 22 to the fluid lines 16, 17. The connection sleeves 18 are connected to the fluid lines 16, 17. Furthermore, the connection sleeves 18 are positioned on the support body 19 in such a way that they are placed against the inlet opening and outlet opening 21, 22 when the tool is being inserted into the thermo-compression chamber 20. The connection sleeves 18 can thereby be elastically deformed. As a result of the deformation, a pressing force is provided which leads to a sufficiently tight connection and to only slight leakage.

The cooling fluid passes via a first fluid line 16 and a first connection sleeve 18 to the inlet opening 21 of the housing 8 and flows away via the outlet opening 22, a second connection sleeve 18 and a second fluid line 17. In the present case, the housing 8 itself serves as the fluid duct and connects the inlet opening and outlet opening 21, 22. In this way, the functional components of the tool logic module 7, which are installed in the housing 8, are cooled.

Ambient air, for example, can be used as the cooling fluid, this air being supplied from outside the thermo-compression chamber.

By using the device in accordance with the invention as part of a multi-platen heat press, it is possible to improve the production of multi-layer circuit boards. The measurement values determined with the aid of the thermo-wire and/or the data obtained therefrom can be supplied to the production control device (13) of the multi-platen heat press on-line, i.e. directly in the on-going production cycle. With the aid of the measurement values and/or the data obtained therefrom, the production control device (13) can decide whether intervention in the on-going process is necessary, and, for example, extend or reduce the holding time or re-adjust the temperature and/or the pressure. In addition, the measurement values and/or the data obtained therefrom can be stored for documentation purposes.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A device to produce multi-layer circuit boards, the device comprising:

a heating plate;

a multi-part tool with a tool lower part and a tool upper part, wherein during normal use of the multi-part tool, at least two functional layers and at least one insulation layer of a multi-layer circuit board to be produced are adapted to be arranged between the tool lower part and the tool upper part, a side of the tool lower part facing away from the tool upper part is positioned against the heating plate;

at least one measurement value sensor provided between the tool upper part and the tool lower part and is adapted to be placed against at least one functional layer and/or insulation layer of the multi-layer circuit board to be produced;

a tool logic module;

a measurement value transmission module with a receiver and with a transmitter cooperating with the receiver, the tool logic module being held on the tool and is arranged for reception of measurement values from the measurement value sensor, the transmitter being arranged for wireless forwarding of the measurement values and/or data obtained therefrom to the receiver of the measurement value transmission module; and a data line running from the transmitting unit of the measurement value transmission module to a superordinate production control device, wherein the transmitter is arranged for onward transmission of the measurement values received by the receiver and/or of the data obtained therefrom to the superordinate production control device via the data line.

2. The device as claimed in claim 1, wherein a signal line is provided in order to transmit the measurement values of the measurement value sensor to the tool logic module.

3. The device as claimed in claim 1, wherein a pressure sensor and/or a temperature sensor and/or a moisture sensor are provided as the measurement value sensor.

4. The device as claimed in claim 3, wherein a thermo-wire is provided which at the same time forms the temperature sensor and the signal line.

5. The device as claimed in claim 1, wherein a lower side of the tool lower part is placed against the heating plate.

6. The device as claimed in claim 5, wherein the tool logic module is fixed to the tool lower part.

7. The device as claimed in claim 5, wherein the receiving unit of the measurement value transmission module is fixedly allocated to the heating plate and/or mounted on the heating plate.

8. The device as claimed in claim 1, wherein the tool logic module provides a housing, in which a module receiver for reception of the measurement values is arranged and/or a processor for aggregating and/or post-processing of the measurement values is arranged and/or the transmitter is arranged, wherein an inlet opening and an outlet opening for a cooling fluid are formed on the housing, and wherein the housing forms a fluid duct for the cooling fluid or surrounds such a duct.

9. The device as claimed in claim 1, wherein the measurement value transmission module provides a support body, and wherein the support body is fixedly allocated to and/or mounted on the heating plate.

10. The device as claimed in claim 9, wherein fluid lines for cooling fluid are run to the support body of the measurement value transmission module, and wherein elastic connection sleeves are provided between the support body and the housing of the tool logic module, which connection sleeves connect the fluid lines to the inlet opening and the outlet opening.

11. The device as claimed in claim 9, wherein the receiver of the measurement value transmission module is fixed to the support body.

12. The device according to claim 1, wherein the device is part of a multi-platen heat press for the production of multi-layer circuit boards by lamination.

13. The device according to claim 1, wherein the tool lower part is positioned directly against the heating plate.

14. The device according to claim 1, wherein the receiver is permanently mounted on the heating plate.

15. The device as claimed in claim 1, wherein the tool logic module is fixed to the tool lower part.

16. The device as claimed in claim 1, wherein the receiver and the transmitter are disposed physically separate from each other.

17. The device as claimed in claim 1, wherein the tool upper part, the tool lower part, the tool logic module, the measurement value sensor and the receiver are configured to be disposed in a thermo-compression chamber.

18. The device as claimed in claim 17, wherein the transmitter is configured to be disposed outside of the thermo-compression chamber.

19. A device to produce multi-layer circuit boards, the device comprising:

a heating plate;

a multi-part tool with a tool lower part and a tool upper part, wherein during normal use of the multi-part tool, at least two functional layers and at least one insulation layer of a multi-layer circuit board to be produced are adapted to be arranged between the tool lower part and the tool upper part, a side of the tool lower part facing away from the tool upper part is positioned against the heating plate;

a measurement value sensor provided between the tool upper part and the tool lower part;

a tool logic module;

a measurement value transmission module with a receiver and a transmitter cooperating with the receiver, the tool logic module being held on the tool and arranged for reception of measurement values from the measurement value sensor; and a data line running from the transmitting unit of the measurement value transmission module to a superordinate production control device, wherein the transmitter is arranged for onward transmission of the measurement values received by the receiver and/or of the data obtained therefrom to the superordinate production control device via the data line.

20. A multi-platen heat press, comprising:

a thermo-compression chamber; and a device to produce multi-layer circuit boards, the device comprising:

a heating plate;

a multi-part tool with a tool lower part and a tool upper part, wherein during normal use of the multi-part tool, at least two functional layers and at least one insulation layer of a multi-layer circuit board to be produced are adapted to be arranged between the tool lower part and the tool upper part, a side of the tool lower part facing away from the tool upper part is positioned against the heating plate;

a measurement value sensor provided between the tool upper part and the tool lower part;

a tool logic module;

a measurement value transmission module with a receiver and a transmitter cooperating with the receiver, the tool logic module being held on the tool and arranged for reception of measurement values from the measurement value sensor; and a data line running from the transmitting unit of the measurement value transmission module to a superordinate production control device, wherein the transmitter is arranged for onward transmission of the measurement values received by the receiver and/or of the data obtained therefrom to the superordinate production control device via the data line, and wherein the tool upper part, the tool lower part, the tool logic module, the measurement value sensor and the receiver are configured to be disposed in a thermo-compression chamber.

21. A device to produce multi-layer circuit boards, the device comprising:

a multi-part tool with a tool lower part and a tool upper part, wherein during normal use of the multi-part tool, at least two functional layers and at least one insulation layer of a multi-layer circuit board to be produced are adapted to be arranged between the tool lower part and the tool upper part;

at least one measurement value sensor provided between the tool upper part and the tool lower part and is adapted to be placed against at least one functional layer and/or insulation layer of the multi-layer circuit board to be produced, the at least one measurement value sensor comprising a temperature sensor constituted by a thermocouple wire permanently bonded to a layer structure as a sacrificial sensor, such that the temperature sensor is not reusable;

a measurement value transmission module comprising a receiver and a transmitter cooperating with the receiver, the tool logic module being held on the tool and configured to receive measurement values from the at least one measurement value sensor;

a tool logic module comprising a transmitter configured for wireless transmission of the measurement values and/or data derived therefrom to the receiver of the measurement value transmission module; and a data line extending from the transmitter of the measurement value transmission module to a higher-level production control device, wherein the transmitter is configured to forward the measurement values received from the receiver and/or the data derived therefrom via the data line to the higher-level production control device.

* * * * *